United States Patent
Wei

(10) Patent No.: US 10,338,429 B2
(45) Date of Patent: Jul. 2, 2019

(54) METHOD FOR MANUFACTURING QUANTUM DOT COLOR FILTER

(71) Applicant: Shenzhen China Star Optoelectronics Technology Co., Ltd., Shenzhen (CN)

(72) Inventor: Hongquan Wei, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 279 days.

(21) Appl. No.: 15/031,280

(22) PCT Filed: Apr. 8, 2016

(86) PCT No.: PCT/CN2016/078875
§ 371 (c)(1),
(2) Date: Apr. 22, 2016

(87) PCT Pub. No.: WO2017/143647
PCT Pub. Date: Aug. 31, 2017

(65) Prior Publication Data
US 2018/0088407 A1    Mar. 29, 2018

(30) Foreign Application Priority Data
Feb. 22, 2016    (CN) .......................... 2016 1 0096445

(51) Int. Cl.
*G02F 1/1335* (2006.01)
*G02B 5/20* (2006.01)
(Continued)

(52) U.S. Cl.
CPC ......... *G02F 1/133516* (2013.01); *G02B 5/20* (2013.01); *G02F 1/1368* (2013.01);
(Continued)

(58) Field of Classification Search
CPC ............. G02F 1/133516; G02F 1/1368; G02F 2202/36; G02F 1/133617; H01L 27/1248;
(Continued)

(56) References Cited

U.S. PATENT DOCUMENTS 8,846,418 B2 *  9/2014   Kim ....................... G03F 7/0002
                                                             438/48

FOREIGN PATENT DOCUMENTS

CN          102983230 A      3/2013
CN          203465442 U      3/2014

* cited by examiner

*Primary Examiner* — Robert S Walters, Jr.
(74) *Attorney, Agent, or Firm* — Leong C. Lei

(57) ABSTRACT

The present invention provides a method for manufacturing a quantum dot color filter, which uses a printing mold to pick up quantum dots and printing the quantum dots into a partially cured photoresist layer and then separates the quantum dots and the printing mold, followed by irradiation of UV light to completely cure the photoresist layer so that the quantum dots may uniformly distributed in the photoresist layer. This simplifies the process of transferring a quantum dot layer and reduces cost; requires no process of forming a sacrifice layer and no step of dissolving the sacrifice layer to prevent damage to the quantum dot layer; allows the quantum dots to be uniformly distributed in the photoresist layer to thereby improve the utilization of the quantum dots; and allows a quantum dot color filter so manufactured to be used with white backlighting or blue backlighting for achieving displaying of three primary colors of red, green, and blue.

13 Claims, 10 Drawing Sheets

(51) Int. Cl.
  *G02F 1/1368* (2006.01)
  *H01L 27/12* (2006.01)
  *B82Y 20/00* (2011.01)
  *B82Y 40/00* (2011.01)
  *B82Y 30/00* (2011.01)

(52) U.S. Cl.
  CPC .... *G02F 1/133617* (2013.01); *H01L 27/1248* (2013.01); *B82Y 20/00* (2013.01); *B82Y 30/00* (2013.01); *B82Y 40/00* (2013.01); *G02F 2202/36* (2013.01); *Y10S 977/774* (2013.01); *Y10S 977/813* (2013.01); *Y10S 977/824* (2013.01); *Y10S 977/887* (2013.01); *Y10S 977/95* (2013.01); *Y10S 977/952* (2013.01)

(58) Field of Classification Search
  CPC ......... B82Y 20/00; B82Y 40/00; B82Y 30/00; Y10S 977/774; Y10S 977/813; Y10S 977/824; Y10S 977/887; Y10S 977/95; Y10S 977/952; G02B 5/20
  See application file for complete search history.

METHOD FOR MANUFACTURING QUANTUM DOT COLOR FILTER

BACKGROUND OF THE INVENTION

1. Field of the Invention

The present invention relates to the field of display technology, and in particular to a method for manufacturing a quantum dot color filter.

2. The Related Arts

Liquid crystal display (LCD) is one of the most widely used flat panel displays. A liquid crystal display panel is a core component of the liquid crystal display. The liquid crystal display panel is generally composed of a color filter (CF) substrate, a thin-film transistor (TFT) array substrate, and a liquid crystal layer arranged between the two substrates. A conventional color liquid crystal display generates the primary colors of red, green, and blue by allowing white backlighting to transmit through a color filter substrate that comprises red, green, and blue color resists formed thereon. Due to the color resists having a relatively low level of light transmission rate, the liquid crystal display is constrained in respect of brightness and color.

Quantum dots (QDs) light-emitting materials are a new technique applicable to the field of liquid crystal display technology. When a semiconductor material is gradually reduced from bulk phase to a critic size (1-20 nm), carrier fluctuation becomes significant and the motion of the carriers are constrained, leading to an increase of kinetic energy of the semiconductor material, and a corresponding electronic structure changes from a continuous energy level structure of the bulk phase to a discrete state of quasi-fission. This phenomenon is referred to as quantum size effect and nanometer particles of the semiconductor material are quantum dots. Common materials of quantum dots are elements of II-VI, III-V, and IV-VI groups and quantum dots of these materials follow the quantum size effect and energy levels vary according to the variation of the size of the quantum dots and the property is also varied with the variation of the size of the quantum dots. For example, wavelengths of absorption and emission vary with the variation of size. This characteristic of quantum dots can be used to control emission wavelength by varying the size thereof. Thus, semiconductor quantum dots have very wide applications in fields of lighting, displays, lasers, and bio-fluorescent tagging.

Quantum dot light emission materials involve advantages, such as concentrated light emission spectrum and high color purity. Application of quantum dot light emission materials in the field of liquid crystal display would greatly increase the color gamut of the traditional liquid crystal displays so as to improve color restoration capability of the liquid crystal displays. Generally, a solution process is used to make a quantum dot layer and a large area quantum dot layer can be formed under the influence of air shearing force. However, it is hard for the solution process to transfer quantum dots to a photo device or a multilayered structure of a quantum dot stack and it is also hard to form a patterned quantum dot layer structure, so that there are limitations for the quantum dots that possess excellent properties to be used in a photoelectric device.

Heretofore, a quantum dot transfer printing process is used to make a quantum dot layer and FIG. 1 is a schematic view illustrating manufacturing of a quantum dot layer with the quantum dot transfer printing process. The method is as follows:

providing a source base plate 100', coupling a SAM (Self-Assembled Monolayer) layer 200' to the source base plate 100' with covalent bond coupling, then, forming a sacrifice layer 300' on the SAM layer 200', and finally, forming a quantum dot layer 400' on the sacrifice layer 300';

providing a transfer-printing mold 500' arranged on the quantum dot layer 400' to allow the transfer-printing mold 500' to pick up the sacrifice layer 300' and the quantum dot layer 400' for having the sacrifice layer 300' separated from the SAM layer 200';

dipping the sacrifice layer 300' and the quantum dot layer 400' in a polarizable solution to dissolve the sacrifice layer 300' that is connected to the quantum dot layer 400'; and finally, transfer-printing the quantum dot layer 400' to a substrate of an optic device.

Such a quantum dot transfer printing method involves an additional sacrifice layer and uses an operation of dissolving the sacrifice layer to make a quantum dot layer and transfers the quantum dot layer to an optical device or a multilayer structure of a quantum dot stack. However, such a method requires an additional process of stacking the sacrifice layer and a step of dissolving the sacrifice layer and this makes the operation complicated and reduces the efficiency. In addition, during the dissolution of the sacrifice layer, since the quantum dot layer is also placed in the solution, damage may be incurred in the quantum dots, leading to impairment of the property of the quantum dot layer.

SUMMARY OF THE INVENTION

An object of the present invention is to provides a method for manufacturing a quantum dot color filter, wherein damage of quantum dots can be prevented during the manufacturing process of a quantum dot layer and the quantum dot layer formed can be uniformly distributed in a photoresist layer to increase the utilization of the quantum dots and also simplify the process of transfer-printing a quantum dot layer, making the manufacturing easy and efficient and reducing manufacturing cost.

To achieve the above objects, the present invention provides a method for manufacturing a quantum dot color filter, which comprises the following steps:

(1) providing a base plate, defining a plurality of first pixel zones, a plurality of second pixel zones, and a plurality of third pixel zones on the base plate, and coating a curable transparent photoresist material on the base plate to form transparent photoresist layer; and providing ultraviolet (UV) light to irradiate the transparent photoresist layer to partially cure and exhibit a soft jelly-like condition;

(2) providing a first source base plate and forming a first quantum dot layer in the form of a single layer on the first source base plate through self-assembly, such that the first quantum dot layer is made up of a plurality of first quantum dots that is uniformly arranged on the first source base plate as a single layer;

(3) providing a first transfer-printing mold, wherein the first transfer-printing mold is provided with a first transfer-printing pattern that corresponds to a pattern of the first pixel zones and applying the first transfer-printing pattern to pick up the first quantum dots from the first source base plate to be transfer-printed to the first pixel zones of the transparent photoresist layer in such a way that a predetermined pressure is applied during transfer-printing to have the first quantum dots transfer-printed to the partially cured transparent photoresist layer and uniformly arranged in the transparent photoresist layer to form first quantum dot patterns;

(4) providing a second source base plate and forming a second quantum dot layer in the form of a single layer on the second source base plate through self-assembly, such that the second quantum dot layer is made up of a plurality of second quantum dots that is uniformly arranged on the second source base plate as a single layer;

(5) providing a second transfer-printing mold, wherein the second transfer-printing mold is provided with a second transfer-printing pattern that corresponds to a pattern of the second pixel zones and applying the second transfer-printing pattern to pick up the second quantum dots from the second source base plate to be transfer-printed to the second pixel zones of the transparent photoresist layer in such a way that a predetermined pressure is applied during transfer-printing to have the second quantum dots transfer-printed to the partially cured transparent photoresist layer and uniformly arranged in the transparent photoresist layer to form second quantum dot patterns;

(6) providing a third source base plate and forming a third quantum dot layer in the form of a single layer on the third source base plate through self-assembly, such that the third quantum dot layer is made up of a plurality of third quantum dots that is uniformly arranged on the third source base plate as a single layer;

(7) providing a third transfer-printing mold, wherein the third transfer-printing mold is provided with a third transfer-printing pattern that corresponds to a pattern of the third pixel zones and applying the third transfer-printing pattern to pick up the third quantum dots from the third source base plate to be transfer-printed to the third pixel zones of the transparent photoresist layer in such a way that a predetermined pressure is applied during transfer-printing to have the third quantum dots transfer-printed to the partially cured transparent photoresist layer and uniformly arranged in the transparent photoresist layer 600 to form third quantum dot patterns;

wherein after steps (2)-(7), a plurality of first quantum dot patterns, a plurality of second quantum dot patterns, and a plurality of third quantum dot patterns are formed in the transparent photoresist layer; and (8) irradiating the transparent photoresist layer with ultraviolet (UV) light to be completely cured so that the first, second, and third quantum dot patterns are fixed in the transparent photoresist layer, and the completely cured transparent photoresist layer and the first, second, and third quantum dot patterns fixed therein collectively form a quantum dot color filter.

The transparent photoresist layer has a thickness of 0.5-5 µm; and the first quantum dot layer, the second quantum dot layer, and the third quantum dot layer all have a thickness of 1-50 µm.

The base plate is a color filter substrate or a thin-film transistor array substrate The first, second, and third pixel zones are a random combination of red, green, and blue pixel zones; and the first, second, and third quantum dot patterns are a random combination of red, green, and blue quantum dot patterns and a color of emission light of the first quantum dot patterns corresponds to a color set for the first pixel zones; a color of emission light of the second quantum dot patterns corresponds to a color set for the second pixel zones; and a color of emission light of the third quantum dot patterns corresponds to a color set for the third pixel zones.

The first, second, and third quantum dots are formed of a material comprising one or more of CdSe, CdS, CdTe, ZnS, ZnSe, CuInS, and ZnCuInS.

The present invention also provides a method for manufacturing a quantum dot color filter, which comprises the following steps:

(1') providing a base plate, defining a plurality of first pixel zones, a plurality of second pixel zones, and a plurality of third pixel zones on the base plate, and coating a curable transparent photoresist material on the base plate to form transparent photoresist layer; and providing ultraviolet (UV) light to irradiate the transparent photoresist layer to partially cure and exhibit a soft jelly-like condition;

(2') providing a first source base plate and forming a first quantum dot layer in the form of a single layer on the first source base plate through self-assembly, such that the first quantum dot layer is made up of a plurality of first quantum dots that is uniformly arranged on the first source base plate as a single layer;

(3') providing a first transfer-printing mold, wherein the first transfer-printing mold is provided with a first transfer-printing pattern that corresponds to a pattern of the first pixel zones and applying the first transfer-printing pattern to pick up the first quantum dots from the first source base plate to be transfer-printed to the first pixel zones of the transparent photoresist layer in such a way that a predetermined pressure is applied during transfer-printing to have the first quantum dots transfer-printed to the partially cured transparent photoresist layer and uniformly arranged in the transparent photoresist layer to form first quantum dot patterns;

(4') providing a second source base plate and forming a second quantum dot layer in the form of a single layer on the second source base plate through self-assembly, such that the second quantum dot layer is made up of a plurality of second quantum dots that is uniformly arranged on the second source base plate as a single layer;

(5') providing a second transfer-printing mold, wherein the second transfer-printing mold is provided with a second transfer-printing pattern that corresponds to a pattern of the second pixel zones and applying the second transfer-printing pattern to pick up the second quantum dots from the second source base plate to be transfer-printed to the second pixel zones of the transparent photoresist layer in such a way that a predetermined pressure is applied during transfer-printing to have the second quantum dots transfer-printed to the partially cured transparent photoresist layer and uniformly arranged in the transparent photoresist layer to form second quantum dot patterns;

wherein after steps (2')-(5'), a plurality of first quantum dot patterns and a plurality of second quantum dot patterns are formed in the transparent photoresist layer; and (6') irradiating the transparent photoresist layer with ultraviolet (UV) light to be completely cured so that the first and second quantum dot patterns are fixed in the transparent photoresist layer, and the completely cured transparent photoresist layer and the first and second quantum dot patterns fixed therein collectively form a quantum dot color filter.

The transparent photoresist layer has a thickness of 0.5-5 µm; and the first quantum dot layer and the second quantum dot layer have a thickness of 1-50 µm.

The base plate is a color filter substrate or a thin-film transistor array substrate.

The first and second pixel zones are a random combination of red and green pixel zones and the third pixel zones are blue pixel zones; and the first and second quantum dot patterns are a random combination of red and green quantum dot patterns and a color of emission light of the first quantum dot patterns corresponds to a color set for the first pixel zones and a color of emission light of the second quantum dot patterns corresponds to a color set for the second pixel zones.

The first and second quantum dots are formed of a material comprising one or more of CdSe, CdS, CdTe, ZnS, ZnSe, CuInS, and ZnCuInS.

The present invention further provides a method for manufacturing a quantum dot color filter, which comprises the following steps:

(1') providing a base plate, defining a plurality of first pixel zones, a plurality of second pixel zones, and a plurality of third pixel zones on the base plate, and coating a curable transparent photoresist material on the base plate to form transparent photoresist layer; and providing ultraviolet (UV) light to irradiate the transparent photoresist layer to partially cure and exhibit a soft jelly-like condition;

(2') providing a first source base plate and forming a first quantum dot layer in the form of a single layer on the first source base plate through self-assembly, such that the first quantum dot layer is made up of a plurality of first quantum dots that is uniformly arranged on the first source base plate as a single layer;

(3') providing a first transfer-printing mold, wherein the first transfer-printing mold is provided with a first transfer-printing pattern that corresponds to a pattern of the first pixel zones and applying the first transfer-printing pattern to pick up the first quantum dots from the first source base plate to be transfer-printed to the first pixel zones of the transparent photoresist layer in such a way that a predetermined pressure is applied during transfer-printing to have the first quantum dots transfer-printed to the partially cured transparent photoresist layer and uniformly arranged in the transparent photoresist layer to form first quantum dot patterns;

(4') providing a second source base plate and forming a second quantum dot layer in the form of a single layer on the second source base plate through self-assembly, such that the second quantum dot layer is made up of a plurality of second quantum dots that is uniformly arranged on the second source base plate as a single layer;

(5') providing a second transfer-printing mold, wherein the second transfer-printing mold is provided with a second transfer-printing pattern that corresponds to a pattern of the second pixel zones and applying the second transfer-printing pattern to pick up the second quantum dots from the second source base plate to be transfer-printed to the second pixel zones of the transparent photoresist layer in such a way that a predetermined pressure is applied during transfer-printing to have the second quantum dots transfer-printed to the partially cured transparent photoresist layer and uniformly arranged in the transparent photoresist layer to form second quantum dot patterns;

wherein after steps (2')-(5'), a plurality of first quantum dot patterns and a plurality of second quantum dot patterns are formed in the transparent photoresist layer; and (6') irradiating the transparent photoresist layer with ultraviolet (UV) light to be completely cured so that the first and second quantum dot patterns are fixed in the transparent photoresist layer, and the completely cured transparent photoresist layer and the first and second quantum dot patterns fixed therein collectively form a quantum dot color filter;

wherein the transparent photoresist layer has a thickness of 0.5-5 μm; and the first quantum dot layer and the second quantum dot layer have a thickness of 1-50 μm; and wherein the base plate is a color filter substrate or a thin-film transistor array substrate.

The efficacy of the present invention is that the present invention provides a method for manufacturing a quantum dot color filter, which uses a printing mold to pick up quantum dots and printing the quantum dots into a partially cured photoresist layer and then separates the quantum dots and the printing mold, followed by irradiation of UV light to completely cure the photoresist layer so that the quantum dots may uniformly distributed in the photoresist layer. This simplifies the process of transferring a quantum dot layer and reduces cost; requires no process of forming a sacrifice layer and no step of dissolving the sacrifice layer to prevent damage to the quantum dot layer; allows the quantum dots to be uniformly distributed in the photoresist layer to thereby improve the utilization of the quantum dots; and allows a quantum dot color filter so manufactured to be used with white backlighting or blue backlighting for achieving displaying of three primary colors of red, green, and blue.

BRIEF DESCRIPTION OF THE DRAWINGS

For better understanding of the features and technical contents of the present invention, reference will be made to the following detailed description of the present invention and the attached drawings. However, the drawings are provided for the purposes of reference and illustration and are not intended to impose limitations to the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
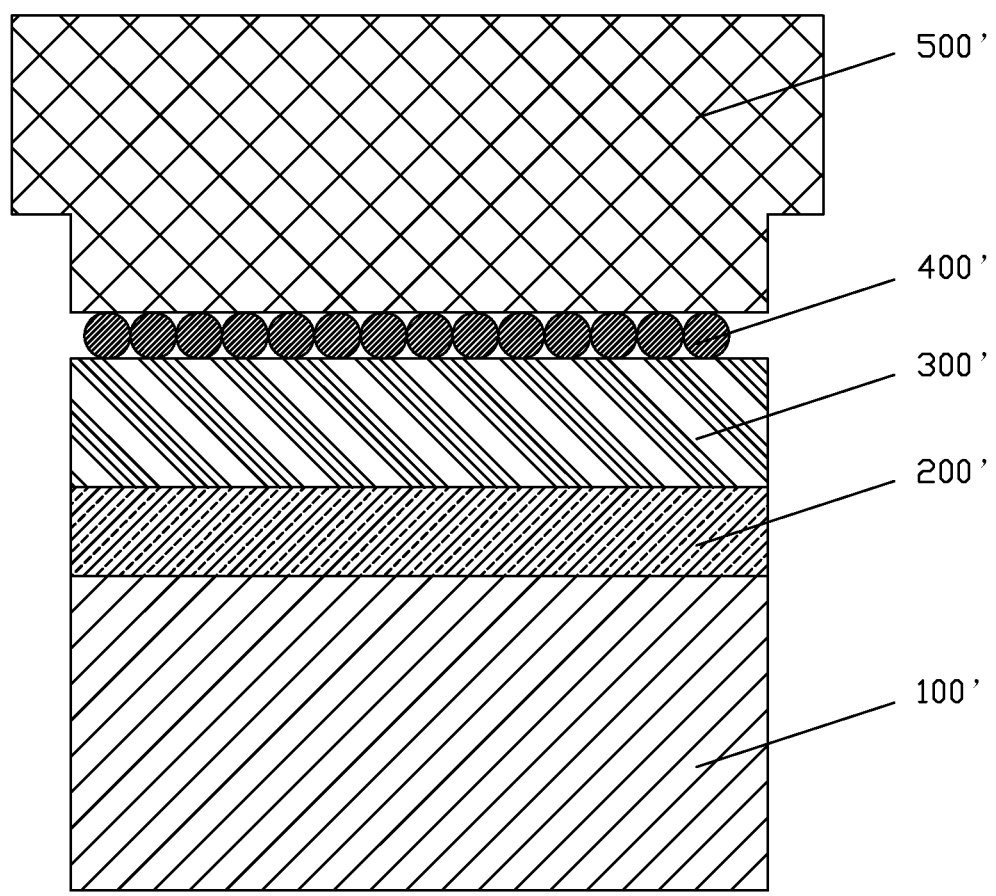
FIG. 1 is a schematic view illustrating manufacturing of a quantum dot layer with a quantum dot transfer printing process.
Figure 2:
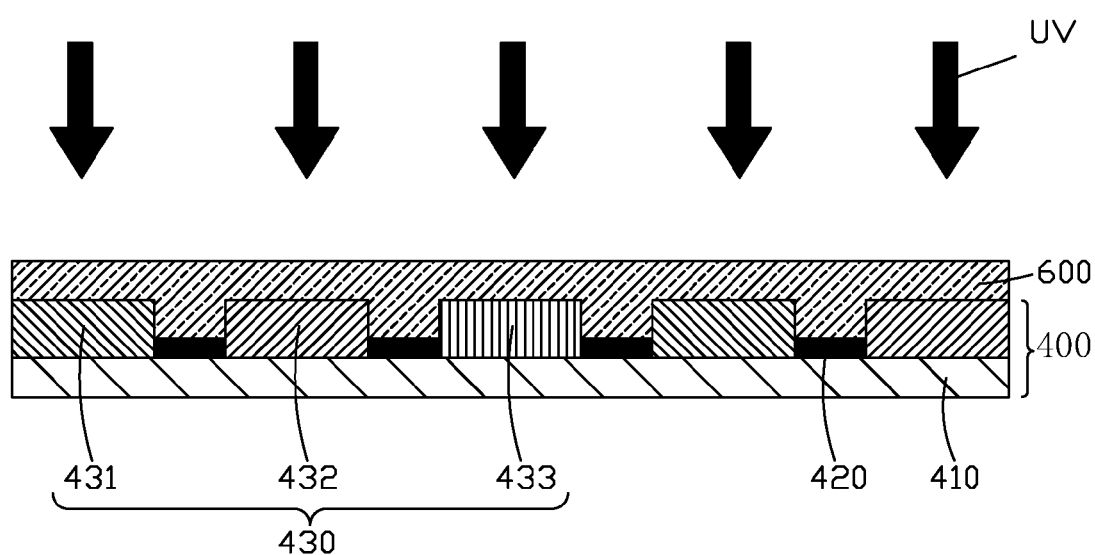
FIG. 2 is a schematic view illustrating step 1 (and step 1') of a method for manufacturing a quantum dot color filter according to a first and a second embodiments of the present invention.

Referring to FIGS. 2-12, the present invention provides a method for manufacturing a quantum dot color filter, comprising the following steps:

Step 1: as shown in FIG. 2, providing a base plate 400, defining a plurality of first pixel zones, a plurality of second pixel zones, and a plurality of third pixel zones on the base plate 400, and coating a curable transparent photoresist material on the base plate 400 to form transparent photoresist layer 600; and providing ultraviolet (UV) light to irradiate the transparent photoresist layer 600 to partially cure and exhibit a soft jelly-like condition.

Specifically, the first, second, and third pixel zones are a random combination of red, green, and blue pixel zones.

Specifically, the transparent photoresist layer 600 has a thickness of 0.5-5 µm.

Specifically, the base plate 400 can be a color filter substrate or a thin-film transistor array substrate.

As shown in FIG. 2, the instant embodiment uses the base plate 400 as a color filter substrate, which comprises a backing plate 410 and a black matrix 420 and color resist layer 430 formed on the backing plate 410, wherein the color resist layer 430 comprises a plurality of first color resist blocks 431, a plurality of second color resist blocks 432, and a plurality of third color resist blocks 433; and the first, second, and third color resist blocks 431, 432, 433 are arranged to respectively correspond to the first, second, and third pixel zones of the base plate 400 and the first, second, and third color resist blocks 431, 432, 433 have colors that corresponding to colors set for the first, second, and third pixel zones.

Figure 3:
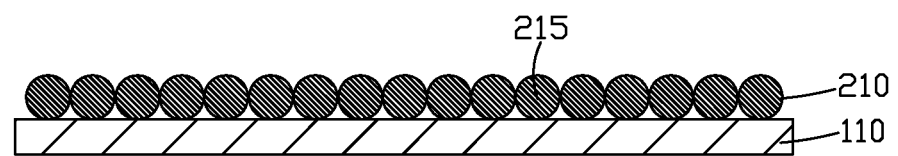
FIG. 3 is a schematic view illustrating step 2 (and step 2') of the method for manufacturing a quantum dot color filter according to the first and second embodiments of the present invention.

Step 2: as shown in FIG. 3, providing a first source base plate 110 and forming a first quantum dot layer 210 in the form of a single layer on the first source base plate 110 through self-assembly, such that the first quantum dot layer 210 is made up of a plurality of first quantum dots 215 that is uniformly arranged on the first source base plate 110 as a single layer.

Specifically, the first quantum dot layer 210 has a thickness of 1-50 µm.

Figure 4:
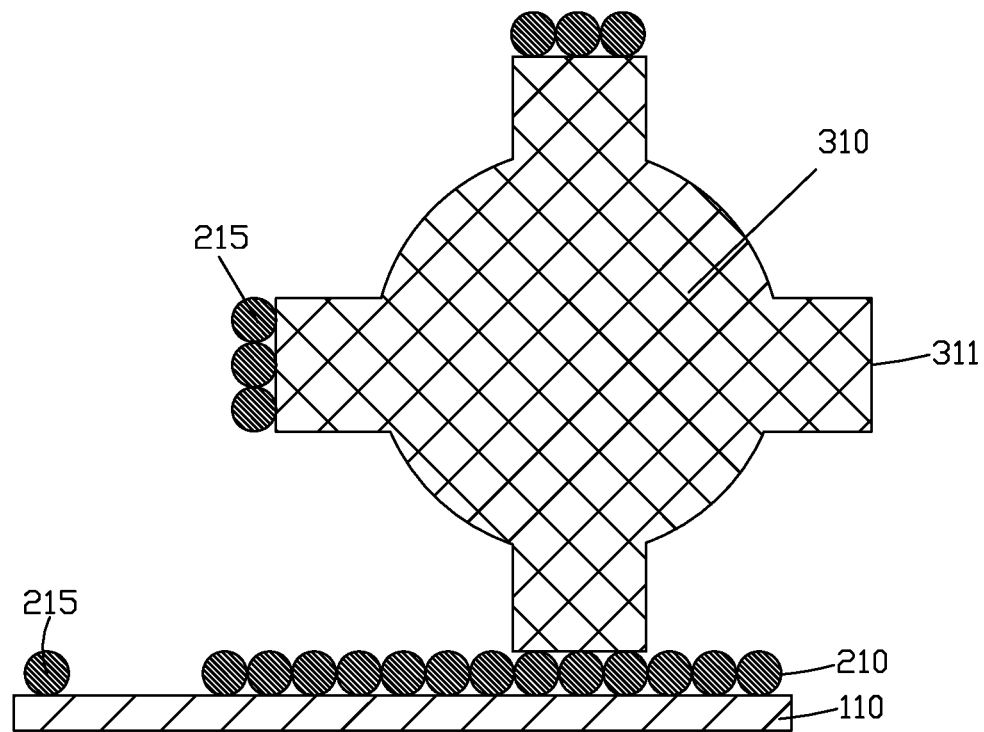
FIGS. 4-5 are schematic views illustrating step 3 (and step 3') of the method for manufacturing a quantum dot color filter according to the first and second embodiments of the present invention.
Figure 5:
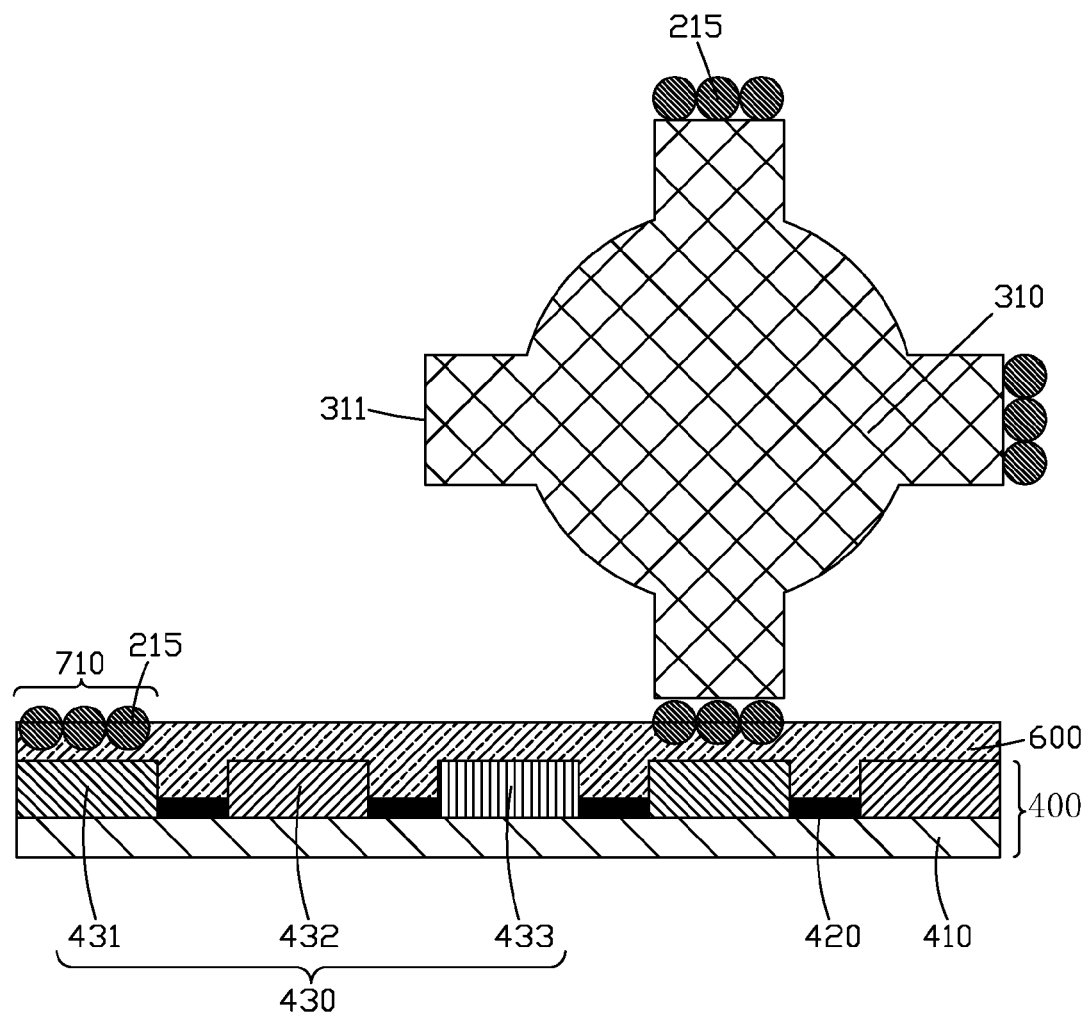

Step 3: as shown in FIGS. 4-5, providing a first transfer-printing mold 310, wherein the first transfer-printing mold 310 is provided with a first transfer-printing pattern 311 that corresponds to a pattern of the first pixel zones and applying the first transfer-printing pattern 311 to pick up the first quantum dots 215 from the first source base plate 110 to be transfer-printed to the first pixel zones of the transparent photoresist layer 600 in such a way that a predetermined pressure is applied during transfer-printing to have the first quantum dots 215 transfer-printed to the partially cured transparent photoresist layer 600 and uniformly arranged in the transparent photoresist layer 600 to form first quantum dot patterns 710.

Figure 6:
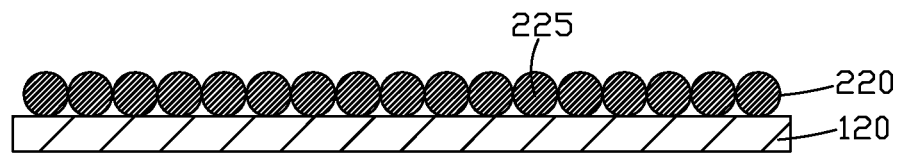
FIG. 6 is a schematic view illustrating step 4 (and step 4') of the method for manufacturing a quantum dot color filter according to the first and second embodiments of the present invention.

Step 4: as shown in FIG. 6, providing a second source base plate 120 and forming a second quantum dot layer 220 in the form of a single layer on the second source base plate 120 through self-assembly, such that the second quantum dot layer 220 is made up of a plurality of second quantum dots 225 that is uniformly arranged on the second source base plate 120 as a single layer.

Specifically, the second quantum dot layer 220 has a thickness of 1-50 µm.

Figure 7:
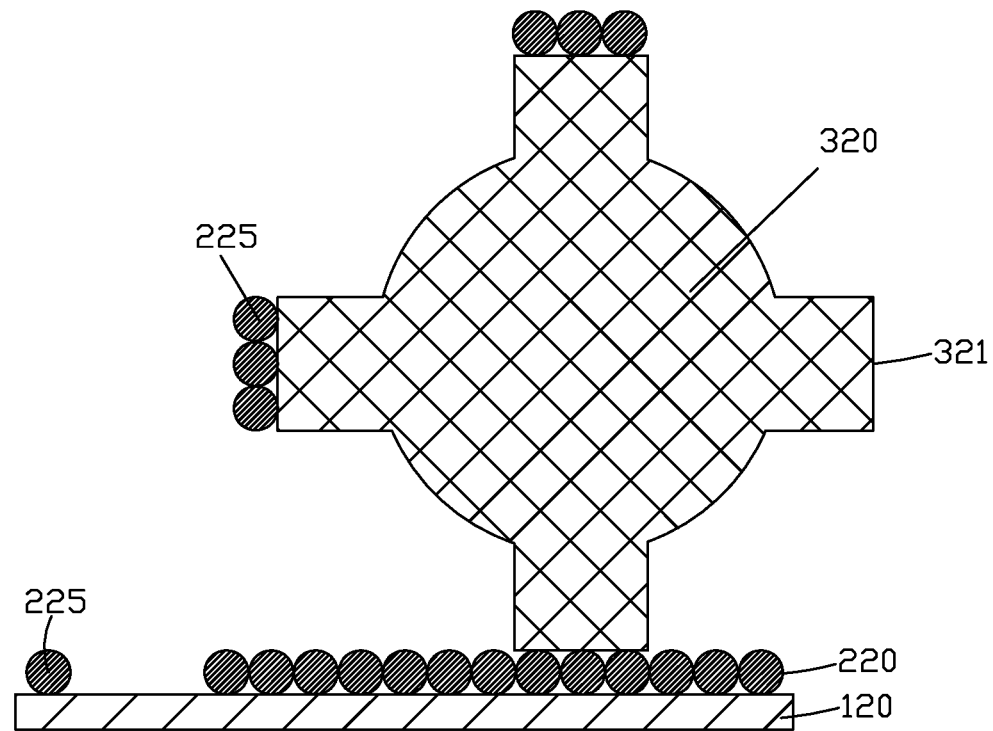
FIGS. 7-8 are schematic views illustrating step 5 (and step 5') of the method for manufacturing a quantum dot color filter according to the first and second embodiments of the present invention.
Figure 8:
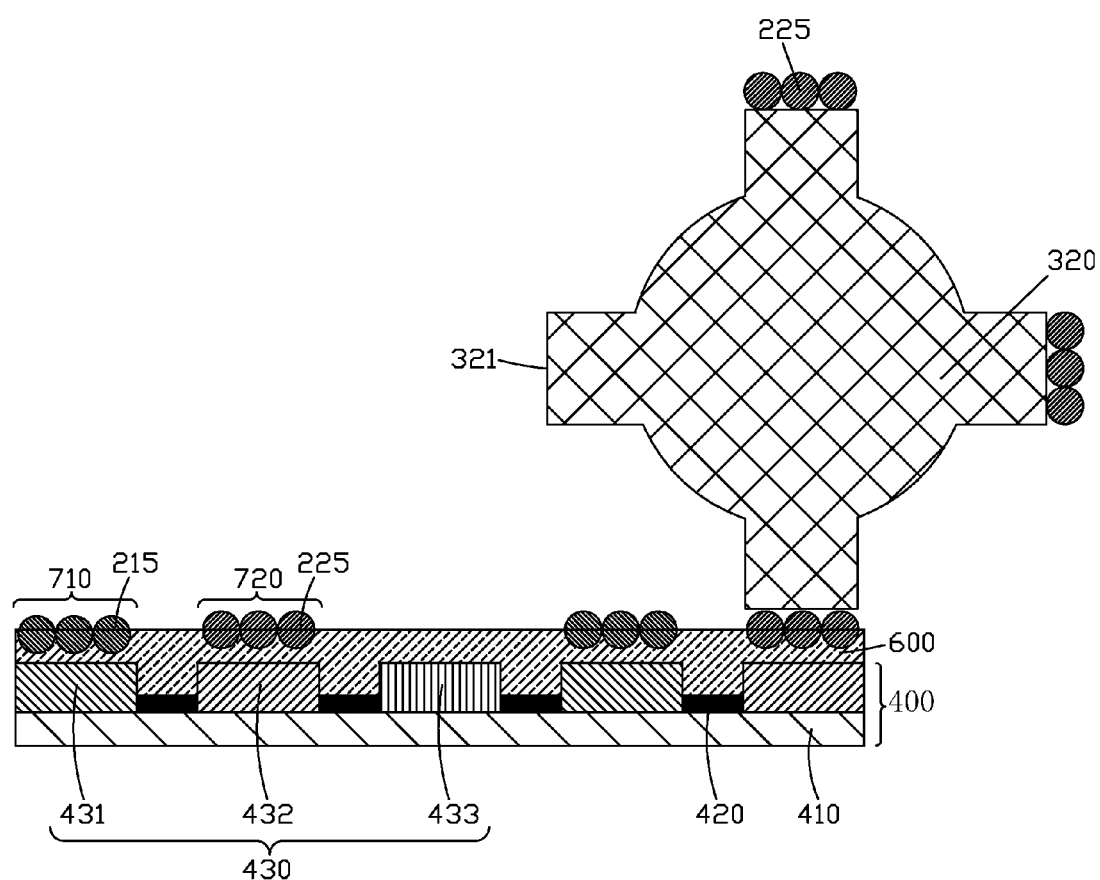

Step 5: as shown in FIGS. 7-8, providing a second transfer-printing mold 320, wherein the second transfer-printing mold 320 is provided with a second transfer-printing pattern 321 that corresponds to a pattern of the second pixel zones and applying the second transfer-printing pattern 321 to pick up the second quantum dots 225 from the second source base plate 120 to be transfer-printed to the second pixel zones of the transparent photoresist layer 600 in such a way that a predetermined pressure is applied during transfer-printing to have the second quantum dots 225 transfer-printed to the partially cured transparent photoresist layer 600 and uniformly arranged in the transparent photoresist layer 600 to form second quantum dot patterns 720.

Figure 9:
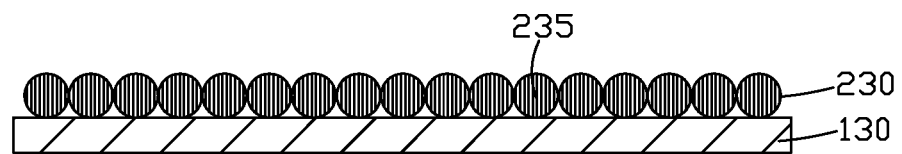
FIG. 9 is a schematic view illustrating step 6 of the method for manufacturing a quantum dot color filter according to the first embodiment of the present invention.

Step 6: as shown in FIG. 9, providing a third source base plate 130 and forming a third quantum dot layer 230 in the form of a single layer on the third source base plate 130 through self-assembly, such that the third quantum dot layer 230 is made up of a plurality of third quantum dots 235 that is uniformly arranged on the third source base plate 130 as a single layer.

Specifically, the third quantum dot layer 230 has a thickness of 1-50 µm.

Figure 10:
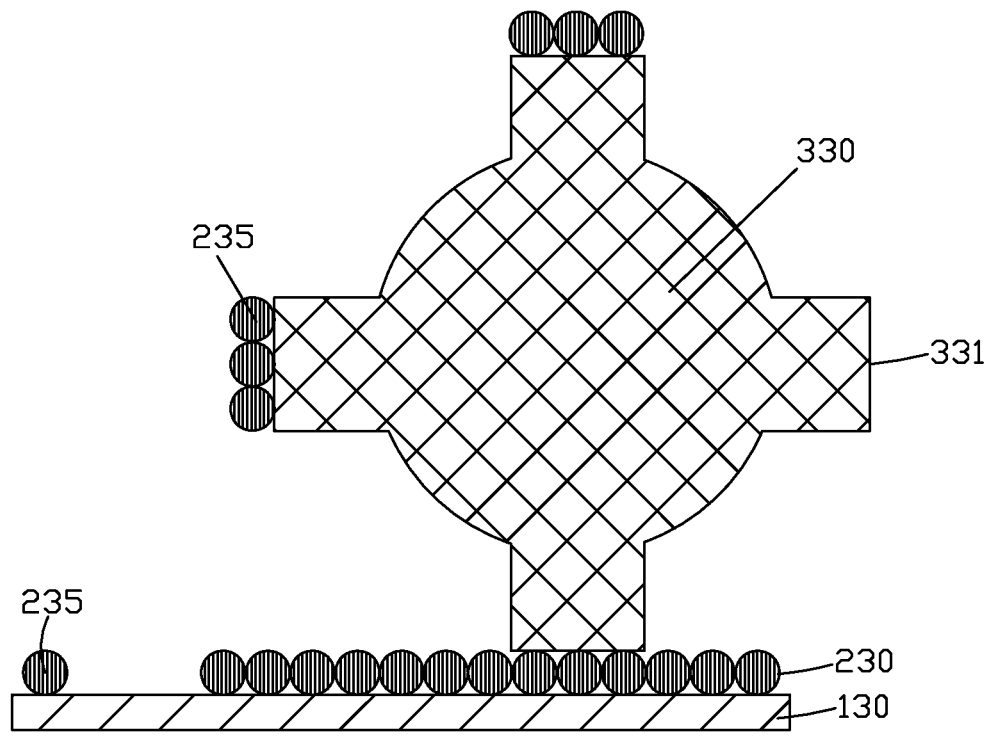
FIGS. 10-11 are schematic views illustrating step 7 of the method for manufacturing a quantum dot color filter according to the first embodiment of the present invention.
Figure 11:
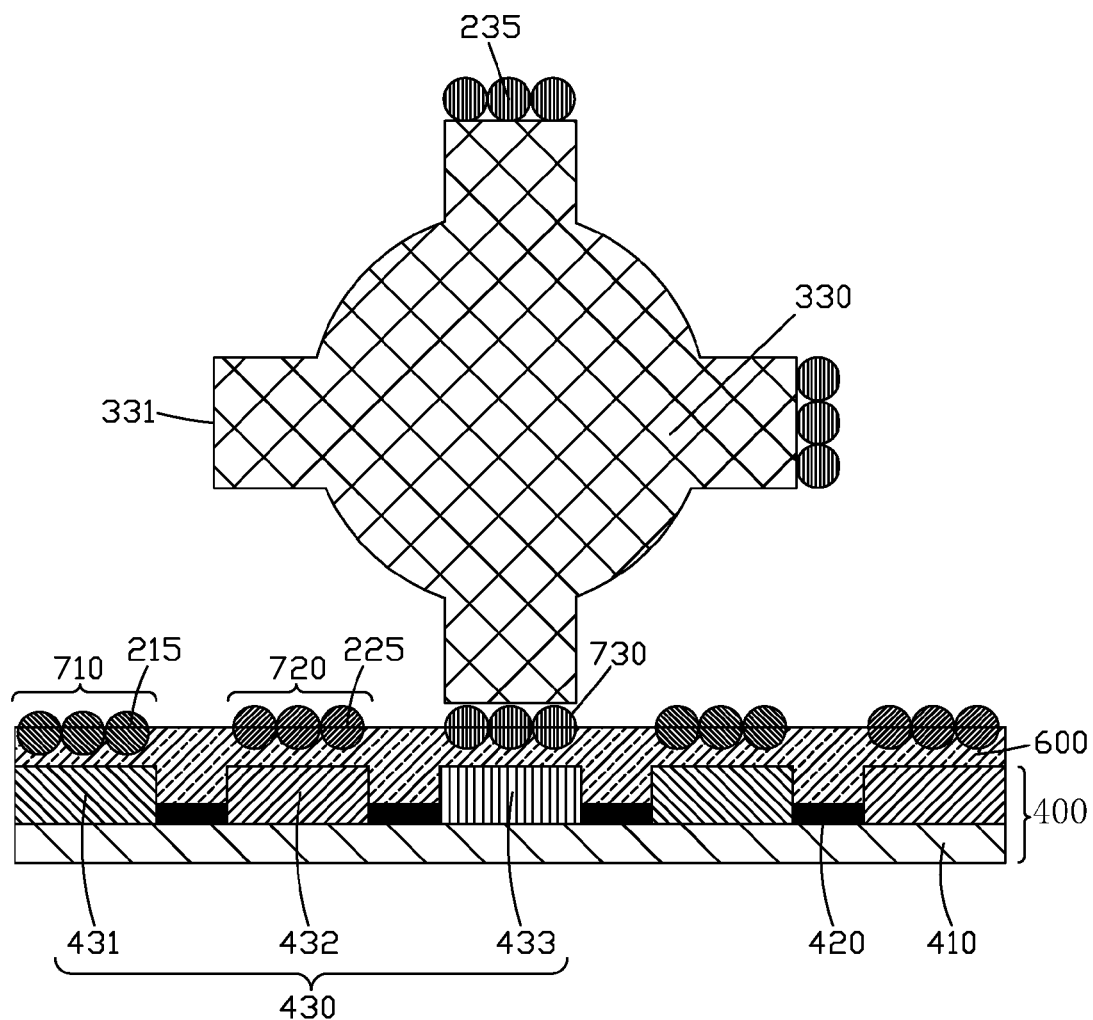

Step 7: as shown in FIGS. 10-11, providing a third transfer-printing mold 330, wherein the third transfer-printing mold 330 is provided with a third transfer-printing pattern 331 that corresponds to a pattern of the third pixel zones and applying the third transfer-printing pattern 331 to pick up the third quantum dots 235 from the third source base plate 130 to be transfer-printed to the third pixel zones of the transparent photoresist layer 600 in such a way that a predetermined pressure is applied during transfer-printing to have the third quantum dots 235 transfer-printed to the partially cured transparent photoresist layer 600 and uniformly arranged in the transparent photoresist layer 600 to form third quantum dot patterns 730.

After Steps 2-7, a plurality of first quantum dot patterns 710, a plurality of second quantum dot patterns 720, and a plurality of third quantum dot patterns 730 are formed in the transparent photoresist layer 600.

Figure 12:
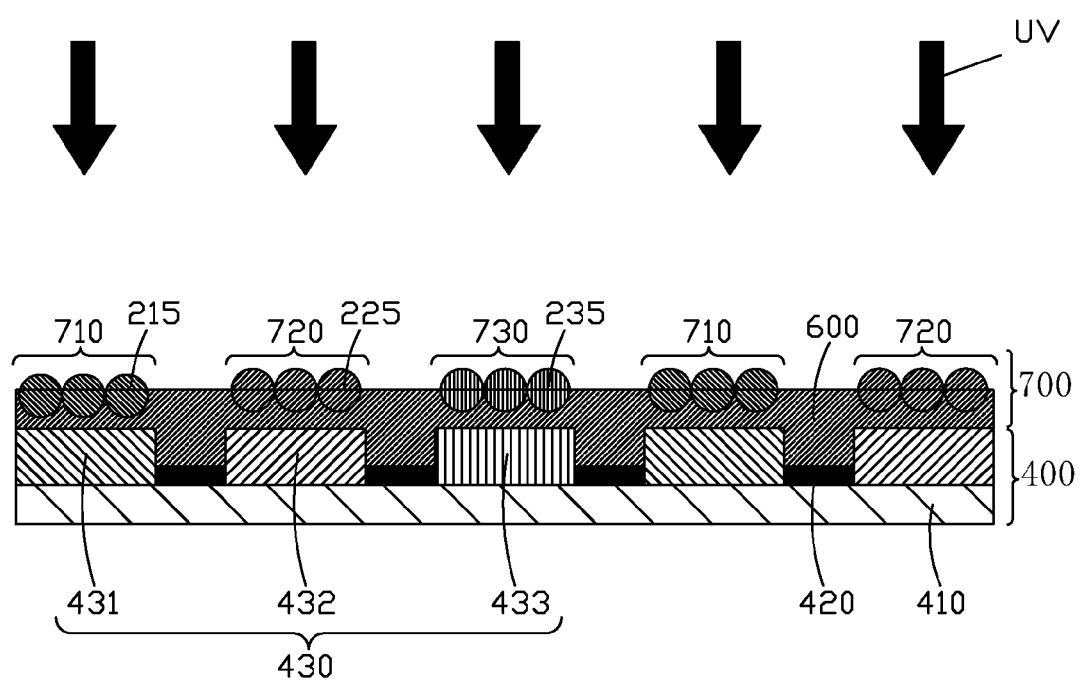
FIG. 12 is a schematic view illustrating step 8 of the method for manufacturing a quantum dot color filter according to the first embodiment of the present invention.

Step 8: as shown in FIG. 12, irradiating the transparent photoresist layer 600 with ultraviolet (UV) light to be completely cured so that the first, second, and third quantum dot patterns 710, 720, 730 are fixed in the transparent photoresist layer 600, and the completely cured transparent photoresist layer 600 and the first, second, and third quantum dot patterns 710, 720, 730 fixed therein collectively form a quantum dot color filter 700.

Specifically, the first, second, and third quantum dot patterns 710, 720, 730 are a random combination of red, green, and blue quantum dots. In other words, the sequence of formation of the red, green, and blue quantum dots is not limited to any specific order provided that the color of emission light of the first quantum dot patterns 710 corresponds to the color set for the first pixel zones; the color of emission light of the second quantum dot patterns 720 corresponds to the color set for the second pixel zones; and the color of emission light of the third quantum dot patterns 730 corresponds to the color set for the third pixel zones.

Specifically, the first, second, and third quantum dots 215, 225, 235 are made of materials selected from II-VI group quantum dot materials and group quantum dot materials, and are preferably selected from one or more of materials comprising CdSe, CdS, CdTe, ZnS, ZnSe, CuInS, and ZnCuInS. Such semiconductor quantum dots follow the quantum size effect and energy levels vary according to the variation of the size of the quantum dots and the property is also varied with the variation of the size of the quantum dots. For example, wavelengths of absorption and emission vary with the variation of the size so that it is possible to control emission wavelength by varying the size thereof. By controlling the size of the quantum dots, wavelength emitted through excitation can be monochromic red light of wavelength 630-720 nm, monochromic green light of wavelength 500-560 nm, or monochromic blue light of wavelength 420-480 nm.

In the above-described method for manufacturing a quantum dot color filter, the quantum dot color filter so manufactured can be used in combination with white backlighting with the red, green, and blue pixel zones of the quantum dot color filter respectively provided with red, green, and blue quantum dot patterns, so that through excitation by the white backlighting, the red, green, and blue quantum dot patterns respectively emit red, green, and blue light to achieve displaying of three primary colors of red, green, and blue.

Referring to FIGS. 2-8 and 13, the present invention also provides another method for manufacturing a quantum dot color filter, comprising the following steps:

Step 1': as shown in FIG. 2, providing a base plate 400, defining a plurality of first pixel zones, a plurality of second pixel zones, and a plurality of third pixel zones on the base plate 400, and coating a curable transparent photoresist material on the base plate 400 to form transparent photoresist layer 600; and providing ultraviolet (UV) light to irradiate the transparent photoresist layer 600 to partially cure and exhibit a soft jelly-like condition.

Specifically, the first and second pixel zones are a random combination of red and green pixel zones and the third pixel zones are blue pixel zones.

Specifically, the transparent photoresist layer 600 has a thickness of 0.5-5 μm.

Specifically, the base plate 400 can be a color filter substrate or a thin-film transistor array substrate.

As shown in FIG. 2, the instant embodiment uses the base plate 400 as a color filter substrate, which comprises a backing plate 410 and a black matrix 420 and color resist layer 430 formed on the backing plate 410, wherein the color resist layer 430 comprises a plurality of first color resist blocks 431, a plurality of second color resist blocks 432, and a plurality of third color resist blocks 433; and the first, second, and third color resist blocks 431, 432, 433 are arranged to respectively correspond to the first, second, and third pixel zones of the base plate 400 and the first, second, and third color resist blocks 431, 432, 433 have colors that corresponding to colors set for the first, second, and third pixel zones.

Step 2': as shown in FIG. 3, providing a first source base plate 110 and forming a first quantum dot layer 210 in the form of a single layer on the first source base plate 110 through self-assembly, such that the first quantum dot layer 210 is made up of a plurality of first quantum dots 215 that is uniformly arranged on the first source base plate 110 as a single layer.

Specifically, the first quantum dot layer 210 has a thickness of 1-50 μm.

Step 3': as shown in FIGS. 4-5, providing a first transfer-printing mold 310, wherein the first transfer-printing mold 310 is provided with a first transfer-printing pattern 311 that corresponds to a pattern of the first pixel zones and applying the first transfer-printing pattern 311 to pick up the first quantum dots 215 from the first source base plate 110 to be transfer-printed to the first pixel zones of the transparent photoresist layer 600 in such a way that a predetermined pressure is applied during transfer-printing to have the first quantum dots 215 transfer-printed to the partially cured transparent photoresist layer 600 and uniformly arranged in the transparent photoresist layer 600 to form first quantum dot patterns 710.

Step 4': as shown in FIG. 6, providing a second source base plate 120 and forming a second quantum dot layer 220 in the form of a single layer on the second source base plate 120 through self-assembly, such that the second quantum dot layer 220 is made up of a plurality of second quantum dots 225 that is uniformly arranged on the second source base plate 120 as a single layer.

Specifically, the second quantum dot layer 220 has a thickness of 1-50 μm.

Step 5': as shown in FIGS. 7-8, providing a second transfer-printing mold 320, wherein the second transfer-printing mold 320 is provided with a second transfer-printing pattern 321 that corresponds to a pattern of the second pixel zones and applying the second transfer-printing pattern 321 to pick up the second quantum dots 225 from the second source base plate 120 to be transfer-printed to the second pixel zones of the transparent photoresist layer 600 in such a way that a predetermined pressure is applied during transfer-printing to have the second quantum dots 225 transfer-printed to the partially cured transparent photoresist layer 600 and uniformly arranged in the transparent photoresist layer 600 to form second quantum dot patterns 720.

After Step 2'-5', a plurality of first quantum dot patterns 710 and a plurality of second quantum dot patterns 720 are formed in the transparent photoresist layer 600.

Figure 13:
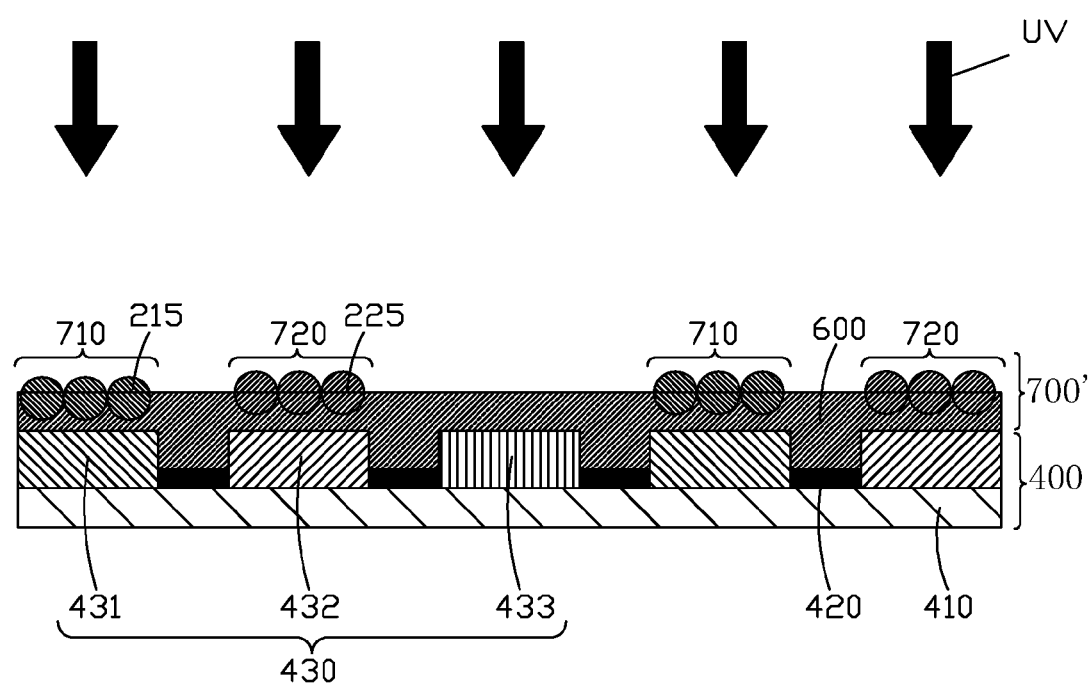
FIG. 13 is a schematic view illustrating step 6' of the method for manufacturing a quantum dot color filter according to the second embodiment of the present invention.

Step 6': as shown in FIG. 13, irradiating the transparent photoresist layer 600 with ultraviolet (UV) light to be completely cured so that the first and second quantum dot patterns 710, 720 are fixed in the transparent photoresist layer 600, and the completely cured transparent photoresist layer 600 and the first and second quantum dot patterns 710, 720 fixed therein collectively form a quantum dot color filter 700'.

Specifically, the first and second quantum dot patterns 710, 720 are a random combination of red and green quantum dots. In other words, the sequence of formation of the red and green quantum dots is not limited to any specific order provided that the color of emission light of the first quantum dot patterns 710 corresponds to the color set for the first pixel zones and the color of emission light of the second quantum dot patterns 720 corresponds to the color set for the second pixel zones.

Specifically, the first and second quantum dots 215, 225 are made of materials selected from II-VI group quantum dot materials and group quantum dot materials, and are preferably selected from one or more of materials comprising CdSe, CdS, CdTe, ZnS, ZnSe, CuInS, and ZnCuInS. Such semiconductor quantum dots follow the quantum size effect and energy levels vary according to the variation of the size of the quantum dots and the property is also varied with the variation of the size of the quantum dots. For example, wavelengths of absorption and emission vary with the variation of the size so that it is possible to control emission wavelength by varying the size thereof. By controlling the size of the quantum dots, wavelength emitted through excitation can be monochromic red light of wavelength 630-720 nm or monochromic green light of wavelength 500-560 nm.

In the above-described method for manufacturing a quantum dot color filter, the quantum dot color filter so manufactured can be used in combination with blue backlighting with the red pixel zones and the green pixel zones of the quantum dot color filter respectively provided with red quantum dot patterns and green quantum dot patterns that under excitation by the blue backlighting emit red light and green light respectively, while the blue pixel zones of the quantum dot color filter are not provided with quantum dot patterns and may allow the blue backlighting to transmit therethrough directly thereby achieving displaying of three primary colors of red, green, and blue.

In summary, the present invention provides a method for manufacturing a quantum dot color filter, which uses a printing mold to pick up quantum dots and printing the quantum dots into a partially cured photoresist layer and then separates the quantum dots and the printing mold, followed by irradiation of UV light to completely cure the photoresist layer so that the quantum dots may uniformly distributed in the photoresist layer. This simplifies the process of transferring a quantum dot layer and reduces cost; requires no process of forming a sacrifice layer and no step of dissolving the sacrifice layer to prevent damage to the quantum dot layer; allows the quantum dots to be uniformly distributed in the photoresist layer to thereby improve the utilization of the quantum dots; and allows a quantum dot color filter so manufactured to be used with white backlighting or blue backlighting for achieving displaying of three primary colors of red, green, and blue.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a quantum dot color filter, comprising the following steps:
   (1) providing a base plate, defining a plurality of first pixel zones, a plurality of second pixel zones, and a plurality of third pixel zones on the base plate, and coating a curable transparent photoresist material on the base plate to form transparent photoresist layer; and providing ultraviolet (UV) light to irradiate the transparent photoresist layer to partially cure and exhibit a partially-cured condition;
   (2) providing a first source base plate and forming a first quantum dot layer in the form of a single layer on the first source base plate through self-assembly, such that the first quantum dot layer is made up of a plurality of first quantum dots that are uniformly arranged on the first source base plate as a single layer;
   (3) providing a first transfer-printing mold, wherein the first transfer-printing mold is provided with a first transfer-printing pattern that corresponds to a pattern of the first pixel zones and applying the first transfer-printing mold having the first transfer-printing pattern to pick up the first quantum dots from the first source base plate to be transfer-printed to first portions of the transparent photoresist layer that respectively correspond to the plurality of first pixel zones of the base plate in such a way that a predetermined pressure is applied during transfer-printing to have the first quantum dots transfer-printed to the partially cured transparent photoresist layer and uniformly arranged in the transparent photoresist layer to form first quantum dot patterns;
   (4) providing a second source base plate and forming a second quantum dot layer in the form of a single layer on the second source base plate through self-assembly, such that the second quantum dot layer is made up of a plurality of second quantum dots that are uniformly arranged on the second source base plate as a single layer;
   (5) providing a second transfer-printing mold, wherein the second transfer-printing mold is provided with a second transfer-printing pattern that corresponds to a pattern of the second pixel zones and applying the second transfer-printing mold having the second transfer-printing pattern to pick up the second quantum dots from the second source base plate to be transfer-printed to second portions of the transparent photoresist layer that respectively correspond to the plurality of second pixel zones of the base plate in such a way that a predetermined pressure is applied during transfer-printing to have the second quantum dots transfer-printed to the partially cured transparent photoresist layer and uniformly arranged in the transparent photoresist layer to form second quantum dot patterns;
   (6) providing a third source base plate and forming a third quantum dot layer in the form of a single layer on the third source base plate through self-assembly, such that the third quantum dot layer is made up of a plurality of third quantum dots that are uniformly arranged on the third source base plate as a single layer;
   (7) providing a third transfer-printing mold, wherein the third transfer-printing mold is provided with a third transfer-printing pattern that corresponds to a pattern of the third pixel zones and applying the third transfer-printing mold having the third transfer-printing pattern to pick up the third quantum dots from the third source base plate to be transfer-printed to third portions of the transparent photoresist layer that respectively correspond to the plurality of third pixel zones of the base plate in such a way that a predetermined pressure is applied during transfer-printing to have the third quantum dots transfer-printed to the partially cured transparent photoresist layer and uniformly arranged in the transparent photoresist layer to form third quantum dot patterns;
   wherein after steps (2)-(7), a plurality of first quantum dot patterns, a plurality of second quantum dot patterns, and a plurality of third quantum dot patterns are formed in the transparent photoresist layer; and
   (8) irradiating the transparent photoresist layer with ultraviolet (UV) light to be completely cured so that the first, second, and third quantum dot patterns are fixed in the transparent photoresist layer, and the completely cured transparent photoresist layer and the first, second, and third quantum dot patterns fixed therein collectively form a quantum dot color filter.

2. The method for manufacturing a quantum dot color filter as claimed in claim 1, wherein the transparent photoresist layer has a thickness of 0.5-5 µm; and the first quantum dot layer, the second quantum dot layer, and the third quantum dot layer all have a thickness of 1-50 µm.

3. The method for manufacturing a quantum dot color filter as claimed in claim 1, wherein the base plate is a color filter substrate or a thin-film transistor array substrate.

4. The method for manufacturing a quantum dot color filter as claimed in claim 1, wherein the first, second, and third pixel zones are a random combination of red, green, and blue pixel zones; and the first, second, and third quantum dot patterns are a random combination of red, green, and blue quantum dot patterns and a color of emission light of the first quantum dot patterns corresponds to a color set for the first pixel zones; a color of emission light of the second quantum dot patterns corresponds to a color set for the second pixel zones; and a color of emission light of the third quantum dot patterns corresponds to a color set for the third pixel zones.

5. The method for manufacturing the quantum dot color filter as claimed in claim 1, wherein the first, second, and third quantum dots are formed of a material comprising one or more of CdSe, CdS, CdTe, ZnS, ZnSe, CuInS, and ZnCuInS.

6. A method for manufacturing a quantum dot color filter, comprising the following steps:
(1') providing a base plate, defining a plurality of first pixel zones, a plurality of second pixel zones, and a plurality of third pixel zones on the base plate, and coating a curable transparent photoresist material on the base plate to form transparent photoresist layer; and providing ultraviolet (UV) light to irradiate the transparent photoresist layer to partially cure and exhibit a partially-cured condition;
(2') providing a first source base plate and forming a first quantum dot layer in the form of a single layer on the first source base plate through self-assembly, such that the first quantum dot layer is made up of a plurality of first quantum dots that are uniformly arranged on the first source base plate as a single layer;
(3') providing a first transfer-printing mold, wherein the first transfer-printing mold is provided with a first transfer-printing pattern that corresponds to a pattern of the first pixel zones and applying the first transfer-printing mold having the first transfer-printing pattern to pick up the first quantum dots from the first source base plate to be transfer-printed to first portions of the transparent photoresist layer that respectively correspond to the plurality of first pixel zones of the base plate in such a way that a predetermined pressure is applied during transfer-printing to have the first quantum dots transfer-printed to the partially cured transparent photoresist layer and uniformly arranged in the transparent photoresist layer to form first quantum dot patterns;
(4') providing a second source base plate and forming a second quantum dot layer in the form of a single layer on the second source base plate through self-assembly, such that the second quantum dot layer is made up of a plurality of second quantum dots that are uniformly arranged on the second source base plate as a single layer;
(5') providing a second transfer-printing mold, wherein the second transfer-printing mold is provided with a second transfer-printing pattern that corresponds to a pattern of the second pixel zones and applying the second transfer-printing mold having the second transfer-printing pattern to pick up the second quantum dots from the second source base plate to be transfer-printed to second portions of the transparent photoresist layer that respectively correspond to the plurality of second pixel zones of the base plate in such a way that a predetermined pressure is applied during transfer-printing to have the second quantum dots transfer-printed to the partially cured transparent photoresist layer and uniformly arranged in the transparent photoresist layer to form second quantum dot patterns;
wherein after steps (2')-(5'), a plurality of first quantum dot patterns and a plurality of second quantum dot patterns are formed in the transparent photoresist layer; and
(6') irradiating the transparent photoresist layer with ultraviolet (UV) light to be completely cured so that the first and second quantum dot patterns are fixed in the transparent photoresist layer, and the completely cured transparent photoresist layer and the first and second quantum dot patterns fixed therein collectively form a quantum dot color filter.

7. The method for manufacturing the quantum dot color filter as claimed in claim 6, wherein the transparent photoresist layer has a thickness of 0.5-5 μm; and the first quantum dot layer and the second quantum dot layer have a thickness of 1-50 μm.

8. The method for manufacturing the quantum dot color filter as claimed in claim 6, wherein the base plate is a color filter substrate or a thin-film transistor array substrate.

9. The method for manufacturing the quantum dot color filter as claimed in claim 6, wherein the first and second pixel zones are a random combination of red and green pixel zones and the third pixel zones are blue pixel zones; and the first and second quantum dot patterns are a random combination of red and green quantum dot patterns and a color of emission light of the first quantum dot patterns corresponds to a color set for the first pixel zones and a color of emission light of the second quantum dot patterns corresponds to a color set for the second pixel zones.

10. The method for manufacturing the quantum dot color filter as claimed in claim 6, wherein the first and second quantum dots are formed of a material comprising one or more of CdSe, CdS, CdTe, ZnS, ZnSe, CuInS, and ZnCuInS.

11. A method for manufacturing a quantum dot color filter, comprising the following steps:
(1') providing a base plate, defining a plurality of first pixel zones, a plurality of second pixel zones, and a plurality of third pixel zones on the base plate, and coating a curable transparent photoresist material on the base plate to form transparent photoresist layer; and providing ultraviolet (UV) light to irradiate the transparent photoresist layer to partially cure and exhibit a partially-cured condition;
(2') providing a first source base plate and forming a first quantum dot layer in the form of a single layer on the first source base plate through self-assembly, such that the first quantum dot layer is made up of a plurality of first quantum dots that are uniformly arranged on the first source base plate as a single layer;
(3') providing a first transfer-printing mold, wherein the first transfer-printing mold is provided with a first transfer-printing pattern that corresponds to a pattern of the first pixel zones and applying the first transfer-printing mold having the first transfer-printing pattern to pick up the first quantum dots from the first source base plate to be transfer-printed to first portions of the transparent photoresist layer that respectively correspond to the plurality of first pixel zones of the base plate in such a way that a predetermined pressure is applied during transfer-printing to have the first quantum dots transfer-printed to the partially cured transparent photoresist layer and uniformly arranged in the transparent photoresist layer to form first quantum dot patterns;
(4') providing a second source base plate and forming a second quantum dot layer in the form of a single layer on the second source base plate through self-assembly, such that the second quantum dot layer is made up of a plurality of second quantum dots that are uniformly arranged on the second source base plate as a single layer;
(5') providing a second transfer-printing mold, wherein the second transfer-printing mold is provided with a second transfer-printing pattern that corresponds to a pattern of the second pixel zones and applying the second transfer-printing mold having the second transfer-printing pattern to pick up the second quantum dots from the second source base plate to be transfer-printed to second portions of the transparent photoresist layer that respectively correspond to the plurality of second pixel zones of the base plate in such a way that a predetermined pressure is applied during transfer-printing to have the second quantum dots transfer-printed to the partially cured transparent photoresist layer and uniformly arranged in the transparent photoresist layer to form second quantum dot patterns;

wherein after steps (2')-(5'), a plurality of first quantum dot patterns and a plurality of second quantum dot patterns are formed in the transparent photoresist layer; and (6') irradiating the transparent photoresist layer with ultraviolet (UV) light to be completely cured so that the first and second quantum dot patterns are fixed in the transparent photoresist layer, and the completely cured transparent photoresist layer and the first and second quantum dot patterns fixed therein collectively form a quantum dot color filter;

wherein the transparent photoresist layer has a thickness of 0.5-5 µm; and the first quantum dot layer and the second quantum dot layer have a thickness of 1-50 µm; and wherein the base plate is a color filter substrate or a thin-film transistor array substrate.

12. The method for manufacturing the quantum dot color filter as claimed in claim 11, wherein the first and second pixel zones are a random combination of red and green pixel zones and the third pixel zones are blue pixel zones; and the first and second quantum dot patterns are a random combination of red and green quantum dot patterns and a color of emission light of the first quantum dot patterns corresponds to a color set for the first pixel zones and a color of emission light of the second quantum dot patterns corresponds to a color set for the second pixel zones.

13. The method for manufacturing the quantum dot color filter as claimed in claim 11, wherein the first and second quantum dots are formed of a material comprising one or more of CdSe, CdS, CdTe, ZnS, ZnSe, CuInS, and ZnCuInS.

* * * * *